United States Patent [19]

Matsuda et al.

[11] Patent Number: 5,756,267
[45] Date of Patent: May 26, 1998

[54] DEVELOPING SOLUTION FOR NEGATIVE TYPE PHOTOSENSITIVE RESIN COMPOSITIONS

[75] Inventors: Nobuaki Matsuda; Kesanao Kobayashi, both of Shizuoka, Japan

[73] Assignee: Fuji Photo Film Co., Ltd., Kanagawa, Japan

[21] Appl. No.: 714,407

[22] Filed: May 29, 1991

[30] Foreign Application Priority Data

May 29, 1990 [JP] Japan .................................. 2-138818

[51] Int. Cl.$^6$ .................................................. G03F 7/32
[52] U.S. Cl. ........................... 430/331; 430/325; 430/309
[58] Field of Search ..................... 430/309, 331, 430/325, 326; 252/547, 548, DIG. 8; 134/38

[56] References Cited

U.S. PATENT DOCUMENTS

| | | | |
|---|---|---|---|
| 4,239,661 | 12/1980 | Muraoka et al. | |
| 4,374,920 | 2/1983 | Wanat et al. | 430/331 |
| 4,565,768 | 1/1986 | Nonogaki et al. | 430/325 |
| 4,801,519 | 1/1989 | Koibuchi et al. | 430/331 |
| 4,806,453 | 2/1989 | Vidusek et al. | 430/312 |
| 4,808,513 | 2/1989 | Lazarus et al. | 430/331 |
| 4,833,067 | 5/1989 | Tanaka et al. | 430/331 |
| 4,914,006 | 4/1990 | Kato et al. | 430/331 |
| 5,019,488 | 5/1991 | Mammato et al. | 430/325 |
| 5,126,230 | 6/1992 | Lazarus et al. | 430/331 |

FOREIGN PATENT DOCUMENTS

| | | | |
|---|---|---|---|
| 0062733 | 10/1982 | European Pat. Off. | 430/331 |
| 63-228144 | 9/1988 | Japan | 430/331 |

Primary Examiner—Janis L. Dote
Attorney, Agent, or Firm—Sughrue, Mion, Zinn, Macpeak & Seas, PLLC

[57] ABSTRACT

A developing solution for negative type photo-sensitive resin compositions which comprises an aqueous solution containing 0.01 to 1.5% by weight of at least one compound selected from quaternary ammonium bases represented by formula (I):

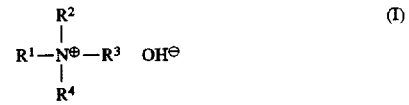

wherein $R^1$, $R^2$, $R^3$ and $R^4$ are the same or different, and are groups selected from the class consisting of alkyl and hydroxyalkyl groups, each group having 1 to 6 carbon atoms, and containing a nonionic, cationic or amphoteric surface active agent. The developing solution allows for development of sharp image patterns within a short period without forming mottles.

6 Claims, No Drawings

DEVELOPING SOLUTION FOR NEGATIVE TYPE PHOTOSENSITIVE RESIN COMPOSITIONS

FIELD OF THE INVENTION

The present invention relates to a developing solution for negative type photosensitive resin compositions which are essential for the preparation of color filters to be applied to a liquid crystal device, image sensor, television, video monitor, computer display, image scanner and the like.

BACKGROUND OF THE INVENTION

In a liquid crystal display which comprises liquid crystal compounds for the control of light transmittance or reflection density and a color filter, the color filter is usually made of a glass plate upon which red, green and blue picture elements and a black matrix are formed by means of dyeing, printing, electrocoating and the like.

JP-A-1-152449 (the term "JP-A" as used herein refers to a "published unexamined Japanese patent application") discloses a composition in which a dye or a pigment is dispersed in a photosensitive resin composition containing a polyfunctional acrylate monomer, an organic polymer binder and a photopolymerization initiator. The composition is coated on a plate such as glass or an acrylate resin, dried, exposed to light through a mask and then subjected to development using a developing solution.

This type of developing solution disclosed in the prior art generally comprises an inorganic alkali salt such as sodium carbonate, sodium hydroxide and potassium hydroxide, and, depending on the purpose, nonionic, cationic or other surface active agents. The use of this type of developing solution has some disadvantages in that mottles are apt to form on the nonimage portion, sharpness of the pattern edge is not sufficient and a prolonged developing time is required.

The inventors of the present invention have conducted intensive studies and found that the afore-mentioned prior art problems can be solved by the use of a quaternary ammonium base in a developing solution for photoresists, such as a tetraalkylammonium hydroxide, a hydroxyalkylammonium hydroxide or the like.

SUMMARY OF THE INVENTION

It is accordingly an object of the present invention to provide a developing solution for negative type photosensitive resin compositions which are essential for the preparation of color filters to be applied to a liquid crystal based display and the like.

Other objects and advantages of the present invention will be made apparent as the description progresses.

In accordance with the present invention the above objects can be attained by a developing solution for negative type photosensitive resin compositions which comprises an aqueous solution containing 0.01 to 1.5% by weight of at least one compound selected from quaternary ammonium bases represented by formula (I):

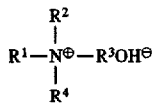

wherein $R^1$, $R^2$, $R^3$ and $R^4$ are the same group or different groups selected from the class consisting of alkyl and hydroxyalkyl groups, each group having 1 to 6 carbon atoms, and containing a nonionic, cationic or amphoteric surface active agent.

The main advantages of the developing solution of the present invention are that an excellent negative pattern can be obtained within a short developing time, formation of mottles on the nonimage part can be reduced, blurring due to the bleeding of colors between picture elements of a color filter can be prevented and defoamability and treatment capacity can be improved.

DETAILED DESCRIPTION OF THE INVENTION

Illustrative examples of quaternary ammonium bases suitable for use in the present invention include tetramethylammonium hydroxide, tetraethylammonium hydroxide, tetra-n-propylammonium hydroxide, tetra-n-butylammonium hydroxide, tetra-n-hexylammonium hydroxide, trimethylhydroxyethylammonium hydroxide (choline) and the like. These salts may be used alone or as a mixture of two or more.

These quaternary ammonium bases are known as ingredients of developing solutions not only for a positive type photoresist but also for a crosslinkable negative type photoresist which comprises an azide compound and an alkali soluble resin such as a novolak resin, a polyvinyl phenol or the like. Such uses have been disclosed, for example, in JP-A-59-195640, JP-A-60-45239, JP-A-60-147731 and JP-A-61-166542. According to these patents, aqueous solutions containing about 2% by weight of quaternary ammonium bases are used for positive type photoresist binders which comprise quinonediazide compounds.

Contrary to these prior art techniques, the inventors of the present invention have found that excellent pattern edge sharpness and developability can be attained by adding 0.01 to 1.5% by weight of a quaternary ammonium base and a nonionic, cationic or amphoteric surface active agent to a developing solution for use in a photopolymerizable negative type photosensitive resin composition which comprises a polyfunctional acrylate monomer, an organic polymer binder and a photo-polymerization initiator. Such an improved developing solution shows excellent performance without forming mottles on the nonimage portion, especially in the case of a photopolymerizable negative type photosensitive resin composition in which a pigment is dispersed.

The quaternary ammonium base is used in an amount of from 0.01 to 1.5% by weight, preferably from 0.03 to 1% by weight, and more preferably from 0.05 to 0.5% by weight. An amount of the base smaller than 0.01% by weight would require a prolonged developing time and an amount of the base greater than 1.5% by weight would not only result in a reduction of sensitivity but also a narrowing of development latitude.

The developing solution of the present invention contains at least one of a nonionic, cationic and amphoteric surface active agent preferably in an amount of 0.01 to 5% by weight.

Preferably, the developing solution may further comprise 0.01 to 10% by weight of an alkanolamine. Preferably, the developing solution comprises an acetylenic alcohol based surface active agent. Also preferably, the developing solution comprises a quaternary ammonium salt based surface active agent.

Compared to the use of such a quaternary ammonium base as a single developer ingredient, developing time can be further shortened without spoiling development latitude and treatment capacity can also be improved by the addition of alkanolamines to the developing solution. Also, wettability can be improved and a smooth negative pattern can be obtained by the addition of a specific surface active agent.

Illustrative examples of alkanolamines suitable for use in the present invention include 1-amino-2-butanol, 2-amino-1-butanol, 4-amino-1-butanol, 3-amino-2,2-dimethyl-1-propanol, 2-(2-aminoethylamino)ethanol, 2-amino-2-ethyl-1,3-propanediol, 6-amino-1-hexanol, 2-amino-2-methyl-1, 3-propanediol, 2-amino-2-methyl-1-propanol, 5-amino-1-pentanol, 3-amino-1,2-propanediol, 1-amino-2-propanol, 3-amino-1-propanol, 2-benzylaminocyclohexanemethanol, N-n-butyl-N-butane-4-ol-amine, tert-butylethanolamine, N-n-butylethanolamine, N-cyclohexylethanolamine, 1,3-diamino-2-propanol, 2-di-n-butylaminoethanol, diethanolamine, 2-diethylaminoethanol, 2-(2-diethylaminoethoxy)ethanol, 3-dimethylamino-1,2-propanediol, diisopropanolamine, 2-diisopropylaminoethanol, 4-dimethylamino-1-butanol, 2-dimethylaminoethanol, 2-(2-dimethylaminoethoxy)ethanol, 6-dimethylamino-1-hexanol, 2-dimethylamino-2-methyl-1-propanol, 1-dimethylamino-2-propanol, 3-dimethylamino-1-propanol, ethanolamine, 2-ethylaminoethanol, 2,2',2",2"'-ethylenedinitrilotetraethanol, N-(β-hydroxypropyl)ethylenediamine, N-(γ-hydroxypropyl)ethylenediamine, N,N,N',N'-tetrakis(2-hydroxypropyl)ethylenediamine, triethanolamine, triisopropanolamine, tris(hydroxymethyl)aminomethane, N-tris(hydroxymethyl)methylglycine and the like. These compounds may be used alone or as a mixture of two or more.

The alkanolamine may be used preferably in an amount of from 0.01 to 10% by weight, more preferably from 0.03 to 5% by weight, most preferably from 0.05 to 1% by weight. Use of an amount of the alkanolamine smaller than 0.02% by weight would not significantly shorten the developing time and an amount larger than 10% by weight would not only result in a reduction of sensitivity, but also a narrowing of development latitude.

The acetylenic alcohol based surface active agent suitable for use in the present invention comprises at least one compound selected from compounds represented by formula (II):

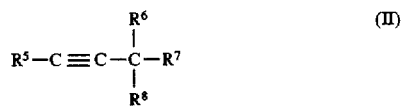

wherein $R^5$ is a hydrogen atom or

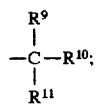

$R^6$, $R^7$, $R^9$, and $R^{10}$ are the same or different alkyl groups, each group having 1 to 6 carbon atoms; and $R^8$ and $R^{11}$ respectively represent —O—$(CH_2CH_2O)_m$—H and —O—$(CH_2CH_2O)_n$—H, where m and n are 0 or the same or different integers of 20 or below.

These compounds are effective as defoaming agents and may be used alone or as a mixture of two or more.

Illustrative examples of such surface active agents, though not specifically restricted, include Surfinol 61, Surfinol 82, Surfinol 104, Surfinol 440, Surfinol 465 and Surfinol 485 (trade names, manufactured by Air Products and Chemicals). The combined use of these agents with other types of surface active agents may also be effective.

The quaternary ammonium salt based surface active agent suitable for use in the present invention comprises at least one compound represented by formula (III):

wherein $R^{12}$, $R^{13}$, $R^{14}$ and $R^{15}$ are the same group or different groups selected from the class consisting of alkyl and hydroxyalkyl groups, each group having 1 to 20 carbon atoms, and a carbonyl group-containing group having 1 to 20 carbon atoms. These agents may be used alone or as a mixture of two or more.

Illustrative examples, although not specifically restricted, include Pionin B-211, Pionin B-611, Pionin B-811, Pionin B-2211, Pionin B-8811, Pionin B-211-B, Pionin B-721-E, Pionin B-821-A, Pionin B-231, Pionin B-276, Pionin B-277, Pionin C-157-A and Pionin D-1105(all trade-names, manufactured by Takemoto Yushi Co., Ltd.) and Coatamin 24P, Coatamin 86P Conc, Coatamin 60W, Coatamine 86W, Coatamine D86P, Sanisol C and Sanisol B-50 (all manufactured by Kao Corp.). The combined use of these agents with other types of surface active agents may also be effective in that developing rate is increased and developing performance is improved such that no mottles are formed on the nonimage portion and the sharpness of patterns is excellent.

Also useful are cationic surface active agents such as alkyl amine salts, alkylpyridinium salts and the like, amphoteric surface active agents such as glycine type, betaine type, alanine type, imidazole type and the like and nonionic surface active agents such as polyoxy-ethylene, polyhydric alcohol, alkanol amide and polyether types.

The surface active agent may be used preferably in an amount of from 0.01 to 5% by weight, more preferably ably from 0.03 to 3% by weight, most preferably from 0.05 to 2% by weight. An amount of the agent smaller than 0.01% by weight would result in insufficient wettability or defoamability and an amount larger than 5% by weight would spoil smoothness of pattern shapes.

A process for the preparation of a color filter utilizing the developing solution of the present invention comprises the following steps: (a) washing a base board, (b) coating a photosensitive resin composition, (c) pre-baking, (d) coating an oxygen cutoff layer and baking, (e) exposure, (f) heating for polymerization enhancement, (g) removal of the oxygen cutoff layer by washing, (h) development, (i) rinse, and (j) post-baking. These steps are repeated three times for red, green and blue, or four times when black is also used. Coating of the oxygen cutoff layer may be omitted provided that the exposure step is performed under a nitrogen atmosphere. If necessary, the heating step for polymerization enhancement may be omitted.

The following describes examples of materials used to prepare color filters.

The base board suitable for the purpose of the present invention may be a glass plate coated or not coated with a metal film, a metal oxide or the like using a spatter or other means, an acrylic plate or similar plates. The photosensitive resin composition comprises a polyfunctional acrylate or methacrylate monomer as a polymerizable compound having an ethylenically unsaturated bond, an organic polymer binder which gives the composition chemical characteristics such as heat resistance and chemical resistance and physical characteristics such as surface hardness and volumetric shrinkage, and a photopolymerization initiator which comprises one or more halomethyl-s-triazine compounds.

Coloring materials may preferably be selected from pigments depending on color durability.

The following describes a preferred embodiment of the negative type photosensitive resin composition for use with the present invention, by way of illustration and not by way of limitation.

As disclosed, for example, in U.S. Pat. No. 3,549,367, a photopolymerizable photosensitive resin composition comprises an addition-polymerizable unsaturated monomer, a photopolymerization initiator and a binder. Such an addition-polymerizable unsaturated monomer may have at least one addition-polymerizable ethylenically unsaturated group and a boiling point of 100° C. or higher at atmospheric pressure. Illustrative examples of such monomers include monofunctional acrylates and methacrylates such as polyethylene glycol mono (meth)acrylate, polypropylene glycol mono (meth)acrylate, phenoxyethyl mono(meth)acrylate and the like; polyfunctional acrylates and methacrylates such as polyethylene glycol di(meth)acrylate, trimethylolethane tri(meth)acrylate, neopentyl glycol (meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl) ether, tri(acryloyloxyethyl)-isocyanurate, (meth)acrylates of addition compounds in which ethylene oxide or propylene oxide has been added to polyfunctional alcohols such as glycerin and trimethylolethane, urethane acrylates such as those disclosed in JP-B-48-41708 (the term "JP-B" as used herein refers to an "examined Japanese patent publication"), JP-B-50-6034 and JP-A-51-37193, polyester acrylates such as those disclosed in JP-A-48-64183, JP-B-49-43191 and JP-B-52-30490, and epoxy acrylates as reaction products of epoxy resins with (meth)acrylic acid. Photocurable monomers and oligomers reported in *Nippon Setchaku Kyokai-shi(Japan Adhesion Journal)*, Vol. 20, No. 300 to 308, may also be useful as the addition-polymerizable unsaturated monomers. Such monomers may be used in an amount of from 5 to 50% by weight, preferably from 10 to 40% by weight.

Illustrative examples of the photopolymerization initiator include vicinal polyketoaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, aromatic acyloin compounds substituted by α-hydrocarbons as disclosed in U.S. Pat. No. 2,722,512, polynuclear quinone complexes disclosed in U.S. Pat. Nos. 3,046,127 and 2,951,758, a combination of triallylimidazole dimer with p-aminophenyl ketone as disclosed in U.S. Pat. No. 3,549,367, benzothiazole compounds and trihalomethyl-s-triazine compounds disclosed in JP-B-51-48516, photo-sensitive s-triazine compounds disclosed in JP-A-63-153542, trihalomethyl-s-triazine compounds disclosed in U.S. Pat. No. 4,239,850, and oxadiazole compounds disclosed in U.S. Pat. No. 4,212,976. The photopolymerization initiator may be used in an amount of from about 0.2 to 20% by weight, preferably from 0.5 to 15% by weight, on solid basis.

A preferable binder for the purpose of the present invention may be a linear high molecular organic polymer having compatibility to monomers, which is soluble in organic solvents and can be applied to an alkaline developing solution. Illustrative examples of such linear high molecular organic polymers include polymers having carboxylic acids on their side chains, such as methacrylic acid copolymers, acrylic acid copolymers, itaconic acid copolymers, crotonic acid copolymers, maleic acid copolymers, partially esterificated maleic acid copolymers and the like, which have been disclosed, for example, in JP-A-59-44615, JP-B-54-34327, JP-B-58-12577, JP-B-54-25957, JP-A-59-53836 and JP-A-59-71048. Acidic cellulose derivatives having carboxylic acids on their side chains may also be useful.

Also useful as binders are addition compounds in which acid anhydrides have been added to polymers having hydroxyl groups, with preferred examples being a copolymer of benzyl (meth)acrylate and (meth)acrylic acid and a multiple copolymer of benzyl (meth)acrylate, (meth)acrylic acid and other monomers. Also useful are water-soluble polymers such as polyvinyl pyrrolidone, polyethylene oxide, polyvinyl alcohol and the like. An alcohol soluble nylon and a polyether of 2,2-bis(4-hydroxyphenyl)propane and epichlorohydrin may also be useful for the purpose of improving the strength of hardened films. These polymers may be used in an optional amount, but preferably in the range of from 30 to 85% by weight. Amounts of these polymers larger than 90% by weight would result in insufficient strength of the formed images.

In addition to the above components, it is preferable to use a thermal polymerization inhibitor such as hydroquinone, p-methoxyphenol, di-t-butyl-p-cresol, pyrogallol, t-butyl catechol, benzoquinone, 4,4'-thiobis(3-methyl-6-t-butylphenol), 2,2'-methylene(4-methyl-6-t-butylphenol), 2-mercaptobenzimidazole or the like. Generally, commercially available monomers contain an appropriate amount of thermal polymerization inhibitors.

With regard to the pigment to be added to the foregoing photosensitive resin composition, azo, anthraquinone, xanthene, quinacridone, indigo, dioxazine, indanthrone and isoindolinone pigments may be useful. Illustrative examples of useful pigments include phthalocyanine blue pigments (C.I. pigment blue 15:6 or C.I. pigment blue 15:3; for example, Lionol Blue ES manufactured by Toyo Ink Manufacturing Co., Ltd. and Chromo Blue A3R by Ciba-Geigy Ltd.), phthalocyanine green pigments (C.I. pigment green 7 or 36 or C.I. pigment green 37; for example, Lionol Green 2YS manufactured by Toyo Ink Manufacturing Co., Ltd.), Perylene-based pigments (C.I. pigment red 155), anthraquinone-based pigments (C.I. pigment red 177; for example, Lionogen Red GD manufactured by Toyo Ink Manufacturing Co., Ltd. and Chromophthal Red BRN by Ciba-Geigy Ltd.) and the like. Most preferable pigments for the purpose of color correction are C.I. pigment yellow 83 or C.I. pigment yellow 154 (for example, Lionogen Yellow 3G manufactured by Toyo Ink Manufacturing Co., Ltd), C.I. pigment violet 23 (for example, Lionogen Violet RL manufactured by Toyo Ink Manufacturing Co., Ltd) and the like. A colored photosensitive resin composition is produced by dispersing such pigments in the foregoing photocurable photosensitive resin composition. These pigments may be used in an amount of from 5 to 90% by weight, preferably from 10 to 60% by weight, on solid basis.

By applying the developing solution of the present invention to these photosensitive resin compositions, an excellent negative pattern can be obtained within a short developing time, formation of mottles on the nonimage part can be reduced, blurring due to the bleeding of colors between picture elements of a color filter can be prevented and defoamability and treatment capacity can be improved.

EXAMPLES

Examples of the present invention are given below by way of illustration and not by way of limitation.

Three aqueous solutions of quaternary ammonium bases, tetramethylammonium hydroxide (TMAH), tetraethylammonium hydroxide (TEAH) and trimethyl(2-hydroxyethyl)

ammonium ammonium hydroxide (choline), were prepared separately. Each of the solutions was then mixed with an alkanolamine (diethanolamine or monoethanolamine as indicated in Table 1) and a surface active agent selected from Surfinol 400 Series (acetylenic alcohol based surface active agents manufactured by Air Products and Chemicals) or Pionin Series (quaternary ammonium salt based surface active agents manufactured by Takemoto Yushi Co., Ltd.) as indicated in Table 1. In this manner, a series of invention developing solution compositions were prepared as shown in Table 1 (Invention Examples 1 to 15). For comparison, another series of compositions were prepared by replacing the quaternary ammonium base (organic base) solution by a 20% (by weight) solution obtained by diluting five times CD (an inorganic alkaline developing solution, manufactured by Fuji Hunt Electronics Technology Inc.) or 0.4 or 0.2% (by weight) aqueous sodium hydroxide, or by increasing the level of TMAH in the organic base solution to 2.0 or 1.7% by weight, as shown in Table 1 (Comparative Examples 1 to 5).

A commercial composition for green color use (trade name, CG-2000; one of "Color Mosaic Series" manufactured by Fuji Hunt Electronics Technology Inc.) was selected as a pigment-dispersed negative type photosensitive resin composition, and coated on a glass plate using a spinner (trade name, 1H-D2; manufactured by Mikasa Co., Ltd.). The thus coated preparation was dried at 70° C. for 10 minutes in a convection oven to form a film of 2.0 μm in thickness.

Next, an oxygen cutoff layer was formed on the thus prepared layer by coating a composition (trade name, CP; manufactured by Fuji Hunt Electronics Technology Inc.) using a spinner at 400 rpm and subsequently drying the coated composition at 70° C. for 10 minutes in a convection oven. The thus prepared sample was exposed to ultraviolet rays through a pattern printed photomask using a 25 kw ultrahigh pressure mercury lamp (pLA-501F, manufactured by Canon Inc.) and then heated at 70° C. for 10 minutes in a convection oven to enhance the polymerization reaction. Thereafter, the oxygen cutoff layer was removed by washing it out with water, and the thus treated sample was subjected to dipping development at room temperature using each of the developing solutions prepared above to obtain a negative pattern. Image profile, sharpness of pattern edge and formation of mottles on nonimage portion of the developed samples were observed under a light microscope, and the results were evaluated in terms of ○ (good), Δ (medium) and x (bad). Regarding the defoamability of the developing solutions, a constant volume of each solution was put in a vessel, shaken for a certain period and then stood still to observe the amount of foam in the solution. The results were evaluated in the same manner as in the above case (○, Δ and x). As shown in Table 1, excellent pattern profiles with no formation of mottles were obtained within a short developing period by the use of the developing solutions of the present invention. Similarly excellent results were obtained when the same experiments and evaluations were repeated using other Color Mosaic Series compositions (red, blue, black, yellow and purple; alone or as a mixture of two or more), or using a transparent type solution with no pigment.

Thus, it is apparent that there has been provided, in accordance with the present invention, a developing solution which can be applied most suitably to negative type photosensitive resin compositions. While the present invention has been described in conjunction with specific embodi-

TABLE 1

Compositions of Developing Solution and Results of Evaluation

| | Composition of Developing Solution | | | | | | | | |
|---|---|---|---|---|---|---|---|---|---|
| | Quaternary Ammonium Base, etc. | | Alkanolamine | | Surface Active Agent | | Developing Time | Pattern | Developing Perform- | Defoam- |
| Example No. | Compound*1 | % | Compound*2 | % | Compound | % | (sec) | Profile | ance | ability |
| Inv. Ex. 1 | TMAH | 0.24 | — | — | Surfinol 440 | 0.1 | 45 | ○ | ○ | ○ |
| Inv. Ex. 2 | TMAH | 0.10 | — | — | Surfinol 440 | 0.1 | 90 | ○ | ○ | ○ |
| Inv. Ex. 3 | TMAH | 0.10 | DEA | 0.10 | Surfinol 440 | 0.1 | 45 | ○ | ○ | ○ |
| Inv. Ex. 4 | TMAH | 0.10 | DEA | 0.10 | Surfinol 465 | 0.1 | 45 | ○ | ○ | ○Δ |
| Inv. Ex. 5 | TMAH | 0.10 | DEA | 0.10 | Surfinol 485 | 0.1 | 45 | ○ | ○ | Δ |
| Inv. Ex. 6 | TMAH | 0.10 | DEA | 0.10 | Pionin B-221 | 0.1 | 45 | ○ | ○ | Δ |
| Inv. Ex. 7 | TMAH | 0.10 | DEA | 0.10 | Pionin C-157-A | 0.1 | 45 | ○ | ○ | Δ |
| Inv. Ex. 8 | TMAH | 0.10 | DEA | 0.10 | Pionin D-1105 | 0.1 | 45 | ○ | ○ | Δ |
| Inv. Ex. 9 | TMAH | 0.10 | DEA | 0.50 | Surfinol 465 | 0.1 | 30 | ○ | ○ | ○Δ |
| Inv. Ex. 10 | TMAH | 0.07 | DEA | 0.30 | Surfinol 440 | 0.1 | 45 | ○ | ○ | ○ |
| Inv. Ex. 11 | TMAH | 0.10 | MEA | 0.10 | Surfinol 440 | 0.1 | 30 | ○ | ○ | ○ |
| Inv. Ex. 12 | TEAH | 0.30 | DEA | 0.10 | Surfinol 440 | 0.1 | 30 | ○ | ○ | ○ |
| Inv. Ex. 13 | TEAH | 0.15 | DEA | 0.10 | Surfinol 440 | 0.1 | 45 | ○ | ○ | ○ |
| Inv. Ex. 14 | Choline | 0.20 | DEA | 0.10 | Surfinol 440 | 0.1 | 30 | Δ | Δ | ○ |
| Inv. Ex. 15 | Choline | 0.10 | DEA | 0.10 | Surfinol 440 | 0.1 | 45 | Δ | Δ | ○ |
| Comp. Ex. 1 | CD | 20 | — | — | — | — | 90 | Δ | Δx | x |
| Comp. Ex. 2 | Aqueous NaOH | 0.4 | — | — | Surfinol 465 | 0.1 | 30 | x | ○ | ○ |
| Comp. Ex. 3 | Aqueous NaOH | 0.2 | — | — | Surfinol 465 | 0.1 | 45 | x | x | ○ |
| Comp. Ex. 4 | TMAH | 2.0 | — | — | Surfinol 465 | 0.1 | 15 | — | *3 | ○ |
| Comp. Ex. 5 | TMAH | 1.7 | — | — | Surfinol 465 | 0.1 | 20 | ○ | *4 | ○ |

*1 TMAH, tetramethylammonium hydroxide; TEAH, tetraethylammonium hydroxide; Choline, trimethyl(2-hydroxy-ethyl)ammonium hydroxide; and CD, an inorganic alkaline developing solution (Fuji Hunt Electronics Technology Inc.).
*2 DEA, diethanolamine; and MEA, monoethanolamine.
*3 Entire peeling.
*4 Peeling for the most part.

What is claimed is:

1. A developing solution for a colored photopolymerizable composition provided on a glass substrate, wherein said colored photopolymerizable composition comprises a carboxylic acid-containing resin, an addition-polymerizable unsaturated monomer, a photopolymerization initiator and a pigment, and said developing solution comprises an aqueous solution containing 0.05 to 0.5% by weight of at least one compound selected from quaternary ammonium bases represented by formula (I):

wherein $R^1$, $R^2$, $R^3$ and $R^4$ are the same or different, and are groups selected from the class consisting of alkyl and hydroxyalkyl groups, each group having 1 to 6 carbon atoms, at least one acetylenic alcohol surface active agent, at least one quaternary ammonium salt surface active agent, and an alkanolamine; wherein said acetylenic alcohol based surface active agent and quaternary ammonium salt surface active agent are collectively present in an amount of 0.01 to 5.0% by weight and said alkanolamine is present in an amount of 0.01 to 10.0% by weight; wherein, (1) said acetylenic alcohol surface active agent is represented by formula (II):

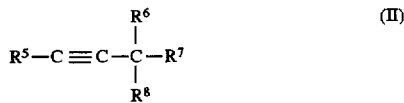

wherein $R^5$ is a hydrogen atom

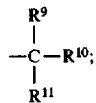

$R^6$, $R^7$, $R^9$ and $R^{10}$ are the same or different alkyl groups, each group having 1 to 6 carbon atoms; and $R^8$ and $R^{11}$ respectively represent $-O-(CH_2CH_2O)_m-H$ and $-O-(CH_2CH_2O)_n-H$, where m and n are 0 or the same or different integers of 20 or less, and (2) said quaternary ammonium salt surface active agent is represented by formula (III):

wherein $R^{12}$, $R^{13}$, $R^{14}$, and $R^{15}$ are the same group or different groups selected from the class consisting of alkyl and hydroxyalkyl groups, each group having 1 to 20 carbon atoms, and a carbonyl containing group having 1 to 20 carbon atoms.

2. A developing solution for a colored photopolymerizable composition as in claim 1, wherein the quaternary ammonium bases are tetramethylammonium hydroxide, tetraethylammonium hydroxide, tetra-n-propylammonium hydroxide, tetra-n-butylammonium hydroxide, tetra-n-hexylammonium hydroxide, trimethylhydroxyethylammonium hydroxide.

3. A developing solution for a colored photopolymerizable composition as in claim 1, wherein the acetylenic alcohol surface active agent represented by formula (II) and the quaternary ammonium salt surface active agent represented by formula (III) are collectively present in an amount of 0.03 to 3% by weight.

4. A developing solution for a colored photopolymerizable composition as in claim 1, wherein the acetylenic alcohol surface active agent represented by formula (II) and the quaternary ammonium salt surface active agent represented by formula (III) are collectively present in an amount of 0.05 to 2% by weight.

5. A developing solution for a colored photopolymerizable composition as in claim 1, wherein the alkanolamine is present in an amount of 0.03 to 5% by weight.

6. A developing solution for a colored photopolymerizable composition as in claim 1, wherein the alkanolamine is present in an amount of 0.05 to 1% by weight.

* * * * *